United States Patent [19]

Grabmaier et al.

[11] Patent Number: 4,914,044
[45] Date of Patent: Apr. 3, 1990

[54] METHOD OF MAKING TANDEM SOLAR CELL MODULE

[75] Inventors: Josef Grabmaier, Berg; Wolfgang Kruehler, Unterhaching; Arthur Endroes, Krumbach, all of Fed. Rep. of Germany

[73] Assignee: Siemens Aktiengesellschaft, Berlin and Munich, Fed. Rep. of Germany

[21] Appl. No.: 221,406

[22] Filed: Jul. 19, 1988

[30] Foreign Application Priority Data

Aug. 20, 1987 [DE] Fed. Rep. of Germany ....... 3727823

[51] Int. Cl.⁴ ............................................ H01L 31/18
[52] U.S. Cl. ...................................... 437/4; 136/244; 136/249; 437/2
[58] Field of Search .............. 136/244, 249 TJ; 437/2, 437/4, 5

[56] References Cited

U.S. PATENT DOCUMENTS

| | | | |
|---|---|---|---|
| 4,234,351 | 11/1980 | Deminet et al. | 437/2 |
| 4,245,386 | 1/1981 | Kausche et al. | 136/251 |
| 4,461,922 | 7/1984 | Gay et al. | 136/249 TJ |

FOREIGN PATENT DOCUMENTS

| | | | |
|---|---|---|---|
| 2938260 | 3/1981 | Fed. Rep. of Germany | 136/258 AM |
| 3322685 | 12/1983 | Fed. Rep. of Germany | 136/258 PC |
| 3545385 | 6/1987 | Fed. Rep. of Germany | 136/244 |

OTHER PUBLICATIONS

K. Okuda et al, Proceedings, 5th E. C. Photoroeltaic Solar Energy Conf. (1983), Reidel Pub. Co. (1984), pp. 822–826.
Grabmaier, "Photovoltaische Bauelemente" GIT Fachz. Lab. 9/86 pp. 859–869.
Lemme "Strom Von de Sonne" ELO 6/1987 pp. 6–11.
Green "Crystalline & Polycrystalline Silicon Tandem Junction Solar Cells:Theoretical Advantages", Solar Cells 18, 1986 pp. 31–40.
Hoyer "Fast SI Sheet Growth by the Horizontal Supported Web Technique" Journal of Crystal Growth 79, 1986 pp. 572–577.
Tawada, "Stability of an Amorphous SIC/SI Tandem Solar Cell with Blocking Barriers" Applied Physics Letter 48, (9) Mar. 3, 1986, pp. 584–586.
Yang, "High Efficiency Amorphous Silicone & Amorphous Silicon–Germanium Tandem Solar Cells" First International Photovoltaic Science & Engineering Conf., (Japan), Nov., 1984.

Primary Examiner—Aaron Weisstuch
Attorney, Agent, or Firm—Hill, Van Santen, Steadman & Simpson

[57] ABSTRACT

A tandem solar module and a method for the manufacture thereof. The tandem solar module has a first, large-area, lower solar sub-module of polycrystalline silicon (c-Si), has an electrically insulating, transparent intermediate layer functioning as an optical coupler, and also has a second, transparent, upper sub-module of amorphous, hydrogenated silicon (a-Si:H). Both sub-modules are provided with mutually independent electrical contacts and each is functional in and of itself. An active material in the first sub-module that is preferably structured strip-shaped can be composed of silicon strips produced in a band drawing method. The second sub-module is executed in thin-film technology in a known way and has a p-i-n structure. Its substrate serves as a covering for the overall module. The tandem solar module exhibits high efficiency and is cost-effective to be manufactured. It can be manufactured with a large-area and exhibits high long-term stability.

5 Claims, 2 Drawing Sheets

METHOD OF MAKING TANDEM SOLAR CELL MODULE

BACKGROUND OF THE INVENTION

The present invention is directed to a tandem solar module as well as to a method for the manufacture thereof.

High-efficiency, large-area, stable and, cost-effective solar cells or modules are needed for photo-voltaic energy generation in the power range.

Known solar modules of crystalline silicon (c-Si) currently achieve effective efficiencies between 10% and 14% for the conversion of sunlight into electrical energy. However, the crystal quality of the silicon must be extremely pure and results in high costs for silicon material. As a result such solar modules cannot economically compete with traditional energy sources.

Solar modules of amorphous, hydrogenated silicon (a-Si:H) are in fact relatively inexpensive to manufacture for this purpose. However, current solar modules of a-Si:H only achieve efficiencies of about 5% through 6%. Further, these modules tend toward long-term instabilities when exposed to light. A noticeable decrease in power of up to about 20% can be observed after a modest operating time.

Further, the solar sprectrum is not optimally exploited by standard solar modules. As a result of the higher band spacing of a-Si:H in comparison to c-Si, modules of amorphous silicon predominantly exhibit absorption in the blue range of the visible spectrum, whereas the crystalline cells absorb more in the red, longer-wave length range. This disadvantage can in fact be avoided by using high-grade, single-crystal silicon wafers and complex cell structures. However, the costs of such solar cells are extremely high.

Even the use of gallium arsenide, which is more receptive to the natural solar spectrum, for photo-voltaic elements has not produced the desired results and is not capable of supplying price-beneficial and high-efficiency solar cells.

Tandem solar cells offer another solution for better adaption of solar cells to the solar spectrum. These are thin-film solar cells of amorphous, hydrogenated silicon and other materials that are deposited or formed directly on top of one another, as is disclosed for example, in a report by J. Yang, R. Mohr and R. Ross in *Proceeding of the First International Photovoltaic Science and Engineering Conference*, Kobe, Japan, 1984, A-IIa-L6. These cells, whose active zones can have p-n or p-i-n structures, utilize the transparency of the a-Si:H material in order to also utilize those photons not absorbed in the upper cell for generating pairs of charge carriers in the lower cell. On the basis of this structure, tandem cells are "series-connected" and are treated like a single cell as a result of the electrical connection. Additives to the a-Si:H layers make it possible to modify the band spacing of the individual cells, so that the tandem cell operates in a greater spectral range than that of an individual cell.

However, the disadvantages such as long-term instability and poor efficiency also occurs in these tandem solar cells. Moreover, the layer thicknesses of the individual cells must be exactly matched to one another, so that the demand for equal currents is met by both individual cells and so that the double cell can operate satisfactorily.

SUMMARY OF THE INVENTION

It is, therefore, an object of the present invention to provide a solar module that is cost-effective to manufacture, exhibits high efficiency in the conversion of sunlight into electrical energy, is stable and has a large-area.

This object is inventively achieved by a tandem solar module of the type initially cited that has:

(a) a first, large-area, lower solar sub-module of polycrystalline silicon;

(b) an electrically insulating, transparent intermediate layer acting as an optical coupler;

(c) a second, large-area, transparent, upper solar sub-module of amorphous, hydrogenated silicon; and (d) mutually independent electrical connections of the two sub-modules.

The present invention provides a cost-effective solar module since no expensive initial materials are required. The advantageous combination of two materials having optimum band spacing increases the overall efficiency of the tandem solar cell, since the solar sprectrum is utilized to a greater degree than in prior art solar cells. The two solar sub-modules are independent solar modules, each of which is fully functional by itself. When combined as a tandem module they supplement each other. Whereas the upper module having a band gap of the a-Si:H of 1.75 eV absorbs more blue light (up to about 750 nm wavelength), the polycrystalline silicon has a band gap of 1.1 eV and absorbs up to 900 nm, even up to 1100 nm with poorer absorption. For appropriate optimization of the tandem solar module, efficiencies of 20% through 25% can be achieved.

The long-term stability of the amorphous solar cell is significantly increased by using extremely thin and transparent a-Si:H layers in the second sub-module. As a result of the separate electrical connections (four leads in comparison to only two leads in known tandem cells), complex matching of the individual sub-modules is eliminated. The latter can therefore be individually optimized independently of one another because the demand for constant currents via both individual cells is no longer necessary.

The use of polycrystalline silicon drawn band-shaped (for example, "S-Web Silicon" disclosed by German Published Application No. 35 20 067) is proposed in one embodiment for providing a large-area arrangement of the solar cells on the smallest possible space.

In this preferred embodiment of the present invention, bars that are parallel to one another are provided on a large-area substrate at defined spacings of about 1 through 2 cm from one another. An electrically conductive layer is applied between these bars and thin strips of polycrystalline silicon material (for example, S-Web-Si) are inserted thereon and are conductively connected to the conductive layer, for example a metal paste. Every strip represents a solar cell in and of itself and therefore has a pn-junction. Length and width of the strips are dimensioned such that an area of about 100 cm$^2$ results for every strip. Larger areas are not suitable since problems in current derivation result in the finished solar cell. The adhesion of contacts to the silicon material deteriorates due to an over-load thereof. Thickness and width of the strips are also dimensioned such that depressions lying between the bars can precisely accept the silicon strips and the bars and silicon strips form a planar surface.

A metallic grid structure forms a front-end contact and simultaneously produces an electrically conductive connection of the front-end contacts to the conductive layer of the respectively neighboring strip solar cell that forms a back-end contact and lies exposed in holes. This provides a series connection of the individual strip solar cells.

However, the invention is not limited to sub-modules having silicon strips that are band-shaped and inserted onto the electrically conductive layer. On the contrary, thin-film solar cells can also be used that are manufactured on large-area substrates in an integrated fashion, these being also capable of being structured strip-shaped. For example, thin-film solar modules are suitable whose silicon material has a polycrystalline structure after deposition or application on the substrate by a recrystallization method (for example, an annealing process).

An optical coupler is provided between the finished, first and second sub-modules, this optical coupler neither absorbing nor reflecting the incident light and being electrically insulating. Glass or plastic, for example, are materials that are suitable for this purpose. The second, upper sub-module of amorphous, hydrogenated silicon is formed in a thin-film structure because of the required transparency and is likewise advantageously structured strip-shaped in order to keep the light shadowing produced by the electrical interconnection as low as possible. The substrate of the second module is directed up and thus simultaneously forms the covering of the tandem solar module. As a result, further material costs are saved.

Finally, the two sub-modules are integrated in a common frame and are provided with separate leads (four contacts), so that every sub-module is completely functional in and of itself.

In the calculation of the overall efficiency of the tandem solar module of the invention, of course, the efficiency of the amorphous, upper sub-module is considered completely dependent on the thickness of this sub-module and on its light transmissivity. The lower sub-module still contributes to the overall efficiency with about 50% of the efficiency of this sub-module by itself.

BRIEF DESCRIPTION OF THE DRAWINGS

The features of the present invention which are believed to be novel, are set forth, with particularly in the appended claims. The invention, together with further objects and advantages, may best be understood by reference to the following description taken in conjunction with the accompanying drawings, in the several figures of which like reference numerals identify like elements, and in which:

DESCRIPTION OF THE PREFERRED EMBODIMENT

Figure 1:
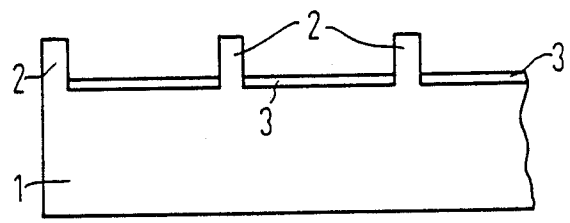
FIGS. 1 through 3 are cross-sectional views of various fabrication steps of the polycrystalline, first sub-module.
Figure 2:
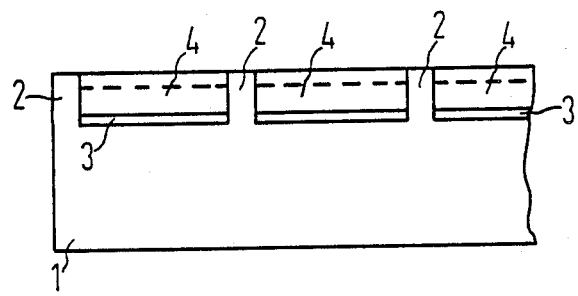
Figure 3:
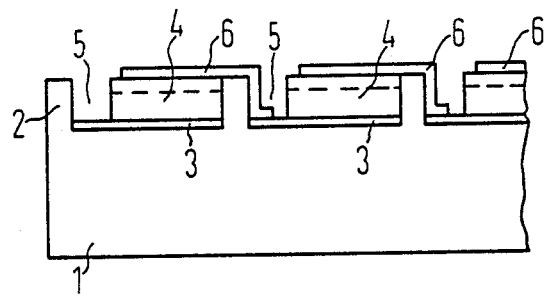

FIGS. 1–3 depict the steps for manufacturing a tandem solar module according to the present invention.

As shown in FIG. 1, a large-area substrate 1 composed of a cost-effective material (for example, glass, ceramic, plastic) contains narrow bars 2 that proceed parallel relative to one another at defined spacings of about 1 through 2 cm, these narrow bars 2 having a width of about 0.5 mm. The interspaces between the webs are filled with an electrically conductive layer 3, being filled up to a height of about 0.1 mm.

As shown in FIG. 2, narrow strips 4 of polycrystalline, p-doped silicon that are about 500 μm thick are placed onto the layers 3 and are in contact with the layer 3. These strips 4 should have a grain size of about 500 μm and, for example, can be manufactured in a band drawing method based on what is referred to as the S-Web Technique that is disclosed by German Published Application No. 35 20 067. Advantageously, the dimensions of the silicon strips 4 coincide precisely with the depressions between the bars 2, so that a planar surface is formed together with the bars 2 after the silicon strips 4 have been inserted.

A pn-junction is now produced in the strips 4 by introducing n-dopants (shown as a broken line in the figure). This, for example, can be produced by phosphorus ion implantation or by drive-in of phosphorus into the silicon in an annealing step from phosphorus-containing layers that are previously applied to the strips 4. In a further embodiment of the invention, the pn-junction of the silicone strips 4 is formed before the strips 4 are placed between the webs 2.

FIG. 3 shows holes 5 in the silicon strips 4 located immediately adjacent the bars 2. These holes 5 can also be provided before the insertion of the strips 4 or can be subsequently produced, for example by milling holes 5 at the ends of the strips 4, these holes 5 extending to the surface of the conductive layer 3.

A front-side contact 6 is applied to the surface of the silicon strips 4 as a grid structure by means of a paste in a silk screening process and is in contact with the conductive layer forming the back-side contact of the solar cells, being contacted thereto in the holes 5. The resulting strip-shaped solar cells, series - connected to form the first sub-module, is then provided with an anti-reflection layer.

Figure 4A:
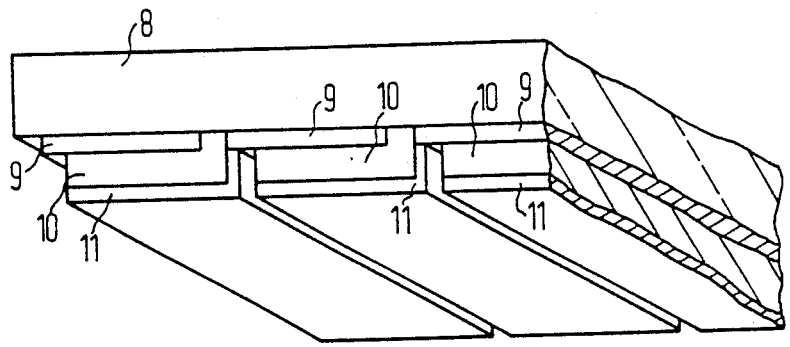
FIGS. 4A–4C show perspective views of the two sub-modules and the optical coupler before they are assembled to form the overall module.
Figure 4B:
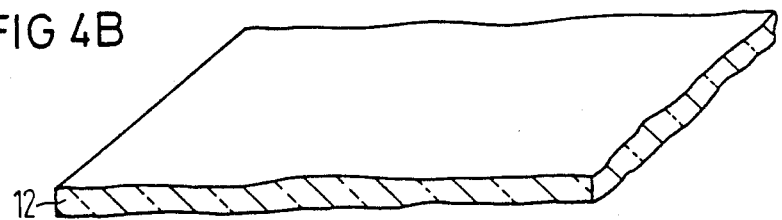
Figure 4C:
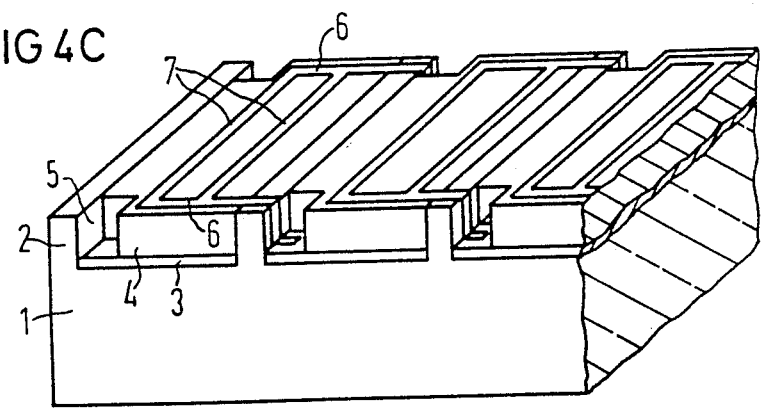

FIG. 4c shows the finished, first sub-module in a perspective view and illustrates the arrangement of the strip pattern 6, 7 (front-side contact) as well as the position of the holes 5 on the sub-module.

FIG. 4a shows a second sub-module of amorphous, hydrogenated silicon that is manufactured in a known way. This solar module is executed as a thin-film structure having transparent materials, for example a glass substrate 8, and TCO electrodes 9, 11. It is also structured strip-shaped and has the same cell width as the first sub-module. The internal structure of the amorphous solar cell is formed such that the back-side contacts 11 of TCO (transparent, conductive oxide, for example doped tin oxide) simultaneously overlap parts of the front-side contacts 9 of the respectively neighboring strip cells and, thus, electrically contact them. As a result, a series circuit of the strip cells of the second sub-module is formed. The active layer 10 is composed of amorphous, hydrogenated silicon and advantageously has a p-i-n cell structure.

The optical coupler shown in FIG. 4b, for example, can be composed of a thin sheet 12 of non-reflecting glass or of likewise non-reflecting plastic film (for example, polyethylene). It has the function of allowing the light having high red content that was not absorbed by the amorphous, upper sub-module to pass through into the lower sub-module. The optical coupler also electrically insulates the two sub-modules from one another.

Finally, the parts shown in FIGS. 4a-4c are joined in the sequence depicted. The sub-modules are provided with separate electrical leads and are integrated in a common frame (not shown in the figure). The substrate 8 of the second sub-module thereby forms the covering of the tandem solar module that has now been completed.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for manufacturing a tandem solar cell module comprising the steps of:
    (a) applying an electrically conductive layer on a substrate of electrically insulating material that has bars proceeding parallel to one another at defined spacings from one another, said layer being applied between said bars;
    (b) inserting between the bars strips of p-doped, polycrystalline silicon fitting over the conductive layer, and the strips being connected to the conductive layer in an electrically conductive fashion thereby defining a plurality of strip-shaped individual solar cells;
    (c) forming a pn-junction in each of the silicon strips;
    (d) providing holes that extend to the surface of the conductive layer in the silicon strips, the holes being provided at the end of said strips;
    (e) applying a strip pattern forming front-side contacts to the strip-shaped, individual solar cells with a silk screening process, said strip pattern being composed of an electrically conductive paste;
    (f) providing an electrically conductive connection between the front-side contact and the conductive layer of a neighboring individual cell, the conductive layer forming a back-side contact of individual solar cells and being exposed in the holes;
    (g) providing the strip-shaped solar cells, series-connected to form a first sub-module, with an anti-reflection layer;
    (h) joining via an optical coupler the first sub-module to a second previously manufactured sub-module of amorphous, hydrogenated silicon solar cells that is of the same size, so that a substrate of the second sub-module forms a covering for the tandem solar cell; and
    (i) integrating the overall module into a frame, whereby independently provided photocurrent generated by the individual sub-modules is provided via a total of at least four electrical contacts.

2. The method according to claim 1, wherein the height and spacing of the bars relative to one another is fashioned such that depressions between the bars correspond exactly to the size of the silicon strips to be accepted therein.

3. The method according to claim 1, wherein the pn-junction in the cells of the first sub-module is produced by phosphorus ion implantation.

4. The method according to claim 1, wherein the production of the pn-junction in the silicon strips of the first sub-module according to method step c) is undertaken before the strips are placed between the bars.

5. The method according to claim 1, wherein the pn-junction in the cells of the first sub-module is produced by drive-in of phosphorus into the silicon.

* * * * *